(12) United States Patent
Gerhard et al.

(10) Patent No.: US 10,811,843 B2
(45) Date of Patent: Oct. 20, 2020

(54) SEMICONDUCTOR LASER

(71) Applicant: OSRAM OLED GMBH, Regensburg (DE)

(72) Inventors: Sven Gerhard, Alteglofsheim (DE); Alfred Lell, Maxhuette-Haidhof (DE); Clemens Vierheilig, Tegernheim (DE); Andreas Loeffler, Neutraubling (DE); Christoph Eichler, Donaustauf (DE)

(73) Assignee: OSRAM OLED GMBH, Regensburg (DE)

( * ) Notice: Subject to any disclaimer, the term of this patent is extended or adjusted under 35 U.S.C. 154(b) by 190 days.

(21) Appl. No.: 15/761,419

(22) PCT Filed: Sep. 27, 2016

(86) PCT No.: PCT/EP2016/073000
§ 371 (c)(1),
(2) Date: Mar. 19, 2018

(87) PCT Pub. No.: WO2017/055284
PCT Pub. Date: Apr. 6, 2017

(65) Prior Publication Data
US 2019/0393676 A1 Dec. 26, 2019

(30) Foreign Application Priority Data
Sep. 28, 2015 (DE) .................. 10 2015 116 335

(51) Int. Cl.
*H01S 5/16* (2006.01)
*H01S 5/028* (2006.01)
(Continued)

(52) U.S. Cl.
CPC ............ *H01S 5/168* (2013.01); *H01S 5/0287* (2013.01); *H01S 5/0421* (2013.01); *H01S 5/166* (2013.01); *H01S 5/323* (2013.01); *H01S 5/3214* (2013.01)

(58) Field of Classification Search
CPC ........ H01S 5/168; H01S 5/323; H01S 5/3214; H01S 5/166; H01S 5/0421; H01S 5/0287;
(Continued)

(56) References Cited

U.S. PATENT DOCUMENTS 5,045,500 A 9/1991 Mitsui et al.
6,373,875 B1 4/2002 Yu et al.
(Continued)

FOREIGN PATENT DOCUMENTS

CN 1957507 A 5/2007
CN 101034727 A 9/2007
(Continued)

OTHER PUBLICATIONS

Japanese Notice of Rejection dated Mar. 5, 2019, issued in corresponding Japanese Patent Application No. 2018-514852.
(Continued)

*Primary Examiner* — Yuanda Zhang
(74) *Attorney, Agent, or Firm* — MH2 Technology Law Group LLP

(57) ABSTRACT

The disclosure relates to a semiconductor laser includes a semiconductor layer sequence with an-n-type n-region, a p-type p-region and an active zone lying between the two for the purpose of generating laser radiation. A p-contact layer that is permeable to the laser radiation and consists of a transparent conductive oxide is located directly on the p-region for the purpose of current input. An electrically-conductive metallic p-contact structure is applied directly to the p-contact layer. The p-contact layer is one part of a cover
(Continued)

Figure 4:
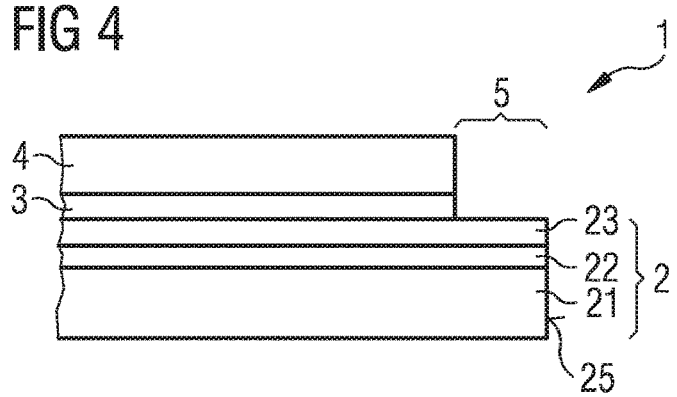

layer, and therefore the laser radiation penetrates as intended into the p-contact layer during operation of the semiconductor laser. Two facets of the semiconductor layer sequence form resonator end surfaces for the laser radiation.

20 Claims, 6 Drawing Sheets

(51) Int. Cl.
*H01S 5/042* (2006.01)
*H01S 5/32* (2006.01)
*H01S 5/323* (2006.01)

(58) Field of Classification Search
CPC .......... H01S 5/162; H01S 5/3211; H01S 5/16; H01S 2301/176; H01S 5/32341
See application file for complete search history.

(56) References Cited

U.S. PATENT DOCUMENTS

| | | | |
|---|---|---|---|
| 10,333,278 B2* | 6/2019 | Vierheilig | H01S 5/1082 |
| 2001/0030329 A1 | 10/2001 | Ueta et al. | |
| 2002/0037022 A1* | 3/2002 | Fukagai | B82Y 20/00 |
| | | | 372/46.01 |
| 2002/0159492 A1 | 10/2002 | Yamamura et al. | |
| 2003/0091079 A1 | 5/2003 | Yokota | |
| 2004/0233950 A1 | 11/2004 | Furukawa et al. | |
| 2005/0163181 A1 | 7/2005 | Takayama | |
| 2005/0232325 A1 | 10/2005 | Ueda et al. | |
| 2005/0279994 A1* | 12/2005 | Ueda | B82Y 20/00 |
| | | | 257/33 |
| 2006/0176921 A1 | 8/2006 | Ueda et al. | |
| 2010/0105158 A1 | 4/2010 | Yamada | |
| 2010/0278207 A1 | 11/2010 | Sonobe et al. | |
| 2014/0301419 A1 | 10/2014 | Cohen et al. | |
| 2016/0141837 A1* | 5/2016 | Gomez-Iglesias | H01S 5/1014 |
| | | | 372/45.01 |

FOREIGN PATENT DOCUMENTS

| | | |
|---|---|---|
| CN | 100474716 C | 4/2009 |
| CN | 101855798 A | 10/2010 |
| CN | 101888059 A | 11/2010 |
| CN | 102130424 A | 7/2011 |
| CN | 102623893 A | 8/2012 |
| DE | 102013211851 A1 | 12/2014 |
| EP | 1 460 741 A1 | 9/2004 |
| JP | H8-236881 A | 9/1996 |
| JP | 200243692 A | 8/2002 |
| JP | 2004111594 A | 4/2004 |
| JP | 2007095758 A | 4/2007 |
| JP | 2009117695 A | 5/2009 |
| JP | 2009181993 A | 8/2009 |
| JP | 201041035 A | 2/2010 |
| JP | 2010040836 A | 2/2010 |
| JP | 2013102249 A | 5/2013 |
| JP | 2013225667 A | 10/2013 |
| WO | 2014202619 A1 | 12/2014 |

OTHER PUBLICATIONS

1st Office Action received in CN Patent Application No. 201680056018.0 dated Sep. 20, 2019.
Notice of Reason for Rejection received in JP Patent Application No. 2018-514852 dated Dec. 3, 2019.
Notification of Grant in Chinese corresponding application No. 201680056018.0 dated Dec. 31, 2019, 10 pages.
Leisher et al., "Etch damage and deposition repair of vertical-cavity surface-emitting lasers", Journal of Vacuum Science and Technology B, vol. 24, No. 1, Jan./Feb. 2006, 4 pages.
Levallois et al., "Design and Fabrication of GaInAsP-InP VCSEL with two a-Si/a-SiNx Bragg Reflectors", Optical and Quantum Electronics, vol. 38, 2006, 23 page.

* cited by examiner

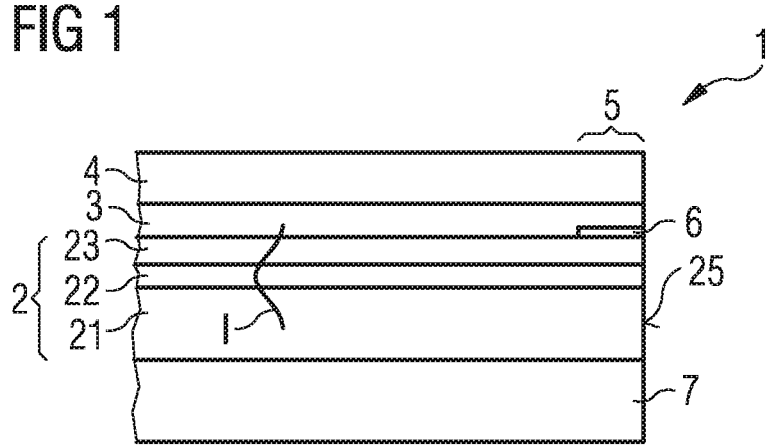
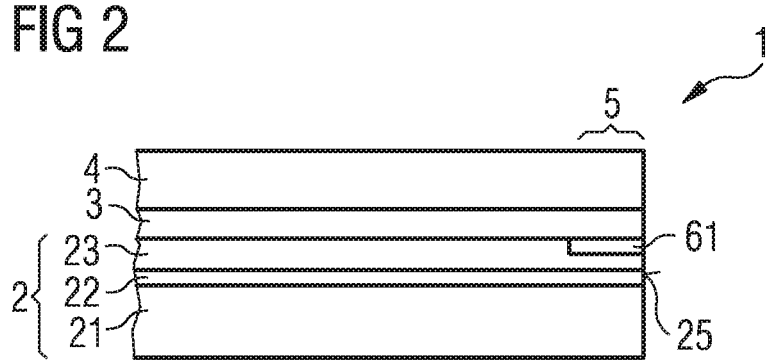
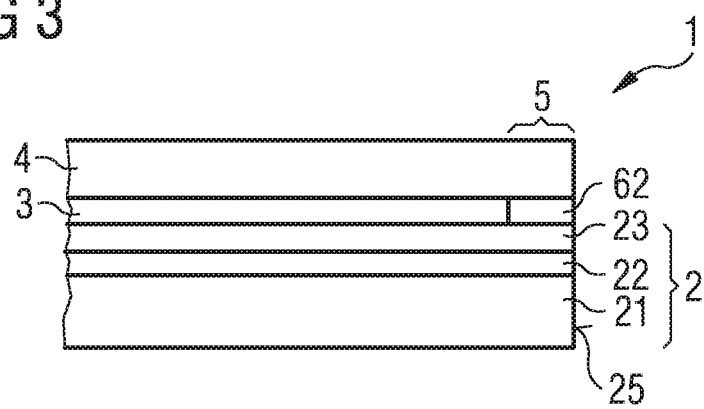

SEMICONDUCTOR LASER

FIELD

The invention relates to a semiconductor laser.

CROSS-REFERENCE TO RELATED APPLICATIONS

This patent application claims the priority of German patent application 10 2015 116 335.7, the disclosure content of which is hereby incorporated by reference.

SUMMARY

The aim of the invention is to provide a semiconductor laser which has a high efficiency and a high output power.

This object is achieved, inter alia, by a semiconductor laser having the features of the independent patent claim. Preferred developments are the subject matter of the dependent claims.

According to at least one embodiment, the semiconductor laser comprises a semiconductor layer sequence. The semiconductor layer sequence comprises an n-conducting n-region. The semiconductor layer sequence likewise has a p-conducting p-region. An active zone is located between the n-region and the p-region. The active zone is designed to generate laser radiation on the basis of electroluminescence. In other words, the n-region, the active zone and the p-region follow one another along or counter to a growth direction of the semiconductor layer sequence, preferably directly one on top of the other.

The semiconductor layer sequence is preferably based on a III-V compound semiconductor material. The semiconductor material is, for example, a nitride-compound semiconductor material such as $Al_nIn_{1-n-m}Ga_mN$ or a phosphide-compound semiconductor material such as $Al_nIn_{1-n-m}Ga_mP$ or also an arsenide-compound semiconductor material such as $Al_nIn_{1-n-m}Ga_mAs$, wherein in each case $0 \leq n \leq 1$, $0 \leq m \leq 1$ and $n+m \leq 1$. In this case, the semiconductor layer sequence can have dopants and additional constituents. For the sake of simplicity, however, only the essential components of the crystal lattice of the semiconductor layer sequence are specified, that is As, Ga, In, N or P, even if these can be partially replaced and/or supplemented by small quantities of other substances.

According to at least one embodiment, the laser radiation has a wavelength of maximum intensity which lies in the near ultraviolet spectral range. Near ultraviolet spectral range, in particular, designates wavelengths between 200 nm and 420 nm inclusive or between 320 nm and 420 nm inclusive. Alternatively, the semiconductor laser is set up for emitting visible laser radiation, for example blue laser radiation or red laser radiation. Blue light preferably relates to a dominant wavelength of at least 420 nm and/or of at most 490 nm. As red light, in particular dominant wavelengths between 600 nm and 700 nm inclusive are considered. Furthermore, it is possible for the laser radiation to be near-infrared radiation, that is to say radiation having a wavelength of maximum intensity of for example between 700 nm and 1600 nm inclusive. Laser radiation in the green or yellow spectral range between 490 nm and 600 nm can also be generated.

According to at least one embodiment, the semiconductor laser has a p-contact layer. The p-contact layer is preferably located directly on the p-region. Furthermore, the p-contact layer is provided directly in the p-region for impressing current.

According to at least one embodiment, the p-contact layer is produced from a material which is transmissive to the laser radiation. Particularly preferably, the p-contact layer is produced from a material from the class of the transparent conductive oxides, TCOs for short. TCOs are transparent, electrically conductive materials, generally metal oxides, such as, for example, zinc oxide, tin oxide, cadmium oxide, titanium oxide, indium oxide or indium tin oxide, ITO for short. In addition to binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can also be p-doped or n-doped.

According to at least one embodiment, the semiconductor laser comprises a p-contact structure. The p-contact structure is preferably located directly on the p-contact layer. The p-contact layer is supplied with current via the p-contact structure. The p-contact structure is thus electrically conductive.

According to at least one embodiment, the p-contact structure is formed from a metal or from a metal alloy. The p-contact structure can be composed of a plurality of partial layers. The p-contact structure preferably comprises one or more of the following metals or consists of one or more of these metals, intermixed or in partial layers: Au, Ag, Ni, Sn, Pd, Pt, Rh, Ti.

According to at least one embodiment, the p-contact layer is a part of a cladding layer of the semiconductor laser. In other words, the p-contact layer is designed to guide a laser radiation within the semiconductor laser. The term 'cladding layer' means in particular that this layer has a lower optical refractive index for the laser radiation than a waveguide layer, which the cladding layer adjoins. In other words, the cladding layer serves to guide the laser radiation in the active zone by means of total reflection. A refractive index of the p-contact layer is thus lower than an effective refractive index for the laser radiation in the active zone.

According to at least one embodiment, the semiconductor layer sequence has two or more than two facets. The facets preferably form end faces for a resonator in which the laser radiation is generated and guided. In particular, one of the facets is coated in a highly reflective manner so that a reflectivity of this facet for the laser radiation is preferably at least 90% or 95% or 99% or 99.8%. A further facet is preferably designed for coupling out the laser radiation from the semiconductor laser; this facet has, for example, a comparatively low reflectivity for the laser radiation of at most 50% or 70% or 85%. In other words, the two facets which are preferably located on opposite ends of the semiconductor layer sequence form two resonator end faces for the laser radiation, between said end faces a resonator is located.

According to at least one embodiment, the semiconductor laser has a current protection region. The current protection region is located directly on at least one of the facets. A current protection region is preferably present at each of the facets which the laser radiation reaches. In the at least one current protection region, an impression of current into the p-region is suppressed. For example, a current impression in the current protection region is reduced by at least a factor of 10 or 100 or 500 in comparison to other regions of the p-region. Since the p-region preferably has only a low electrical conductivity in the direction parallel to the active zone, it is thus possible to prevent the active zone from being supplied with current directly at the facets.

According to at least one embodiment, the current protection region has an extent of greater than 0 in the direction perpendicular to the associated facet; in particular, said extent is at least 0.5 µm or 5 µm or 10 µm. Alternatively or additionally, the extent of the current protection region is at most 100 µm or 30 µm or 20 µm. Furthermore, it is possible for an extent of the current protection region to be at most 20% or 10% or 5% or 2% of a length of the resonator for the laser radiation.

In at least one embodiment, the semiconductor laser comprises a semiconductor layer sequence. The semiconductor layer sequence comprises an n-conducting n-region, a p-conducting p-region and an intermediate active zone for generating laser radiation. In order to impress current, a p-contact layer, which is transmissive to the laser radiation, is located directly on the p-region. An electrically conductive and metallic p-contact structure is attached directly to the p-contact layer. The p-contact layer is part of a cladding layer for guiding the laser radiation. Two facets of the semiconductor layer sequence form resonator end faces for the laser radiation. In at least one current protection region directly on at least one of the facets, a current impression into the p-region is suppressed. In the direction perpendicular to the associated facet, the current protection region has an extent of at least 0.5 µm and of at most 100 µm and additionally of at most 20% of a resonator length for the laser radiation.

In the comparatively strongly growing markets of laser-based applications, for example for projection, illumination or material processing, conventional laser diodes are limited in terms of their maximum output power, efficiency and service life. In the case of the semiconductor laser described here, an efficient wave guide with low optical losses can be achieved with low operating voltage by means of the transparent p-contact layer. Likewise, due to the current protection region a spontaneous failure rate on account of optical damage to the facets, also referred to as catastrophic optical damage or COD for short, is reduced. Furthermore, the p-region of the semiconductor layer sequence can be made thinner, since the p-contact layer is part of the associated cladding layer. As a result, an operating voltage can be reduced.

According to at least one embodiment, the p-contact layer and/or the p-contact structure, in the direction parallel to the active zone, terminate flush with at least one or, preferably, with all facets and/or resonator end faces.

According to at least one embodiment, the laser radiation intentionally enters the p-contact layer during operation of the semiconductor laser. In other words, the p-contact layer is part of a system for wave guiding in the semiconductor laser.

According to at least one embodiment, an electrical insulator layer is located in at least one current protection region between the p-contact layer and the p-region. The insulator layer is electrically insulating or electrically poorly conductive, so that the conductivity of the insulator layer is then lower by at least a factor of 10 or 100 or 1000 than a conductivity of the p-contact layer. The insulator layer is formed, for example, from a ceramic material, glass, a dielectric, a nitride and/or an oxide. For example, the insulator layer consists of or comprises one or more of the following materials: $Al_2O_3$, $SiO_2$, $TiO_2$, $Ta_2O_5$, $HfO_2$, $Si_3N_4$, AlN, SiC, diamond-like carbon or DLC for short. The insulator layer is preferably produced by means of atomic layer deposition, ALD for short. Alternatively, it is possible for the insulator layer to be produced by sputtering, chemical vapor deposition or thermal evaporation.

According to at least one embodiment, the insulator layer has a constant thickness in the entire current protection region. In other words, no specific thickness variation of the insulator layer is set.

According to at least one embodiment, a thickness of the insulator layer is at most 75% or 50% or 20% or 5% of a thickness of the p-contact layer. Alternatively or additionally, the thickness of the insulator layer is at least 20 nm or 50 nm or 100 nm and/or at most 1 µm or 500 nm or 100 nm. Alternatively, the insulator layer can be exactly as thick as the p-contact layer.

According to at least one embodiment, in at least one current protection region the p-region is modified directly on the p-contact layer. As a result of the modification, current injection into the p-region is prevented or greatly reduced in this current protection region. For example, a roughening is produced in the current protection region at the p-region or a crystal quality of the semiconductor layer sequence and/or a p-conductivity of the semiconductor layer sequence is reduced. This can be achieved, for example, by back-sputtering, etching or by plasma damage to the semiconductor layer sequence. In other words, the modification increases a contact resistance between the p-contact layer and the p-region.

According to at least one embodiment, in at least one current protection region the p-contact layer is modified directly at the p-region. By modifying the p-contact layer, current injection into the p-region is reduced in this current protection region. For example, in the case of a transparent conductive oxide for the p-contact layer, a contact resistance and/or a current conductivity towards the p-region can be set by means of an adapted temperature treatment in combination with a selective covering.

According to at least one embodiment, the p-contact layer and the p-contact structure are removed, preferably completely removed, from at least one current protection region. In this current protection region, the p-type contact layer and the p-contact structure are preferably not replaced by other components of the semiconductor laser. For example, a recess or a cavity is formed on the current protection region at the location of the p-contact layer and/or the p-contact structure.

According to at least one embodiment, in the current protection region the p-contact layer is removed and at least one additional layer is located in said current protection region. The one or more additional layer(s) is/are electrically insulating and preferably applied directly to the p-region. Furthermore, the at least one additional layer preferably has a higher specific thermal conductivity than the p-region and/or than the p-contact layer. The additional layer can be formed from the same materials as the insulator layer. In this respect, reference is made to the statements relating to the insulator layer with regard to the materials for the additional layer.

According to at least one embodiment, the p-region has a greater thickness in the at least one current protection region than in remaining regions of the semiconductor layer sequence. The p-contact layer is preferably not present in the current protection region. For example, the p-region outside the current protection region is removed by etching and subsequently filled with the p-contact layer. In this case, it is possible for the p-contact layer to terminate flush with the p-region in the direction away from the active zone, at least at a boundary between the current protection region and remaining regions of the semiconductor layer sequence.

According to at least one embodiment, there is a current protection region from which the p-contact layer is only partially removed. In particular, a gradually changing refractive index is then present in said current protection region because of the p-contact layer. An effective refractive index for the laser radiation in the p-contact layer in the current protection region preferably decreases in the direction towards the associated facet and/or in the direction away from the active zone. As a result, optical losses at the facet on the current protection region can be reduced.

According to at least one embodiment, the p-contact layer is completely removed directly at the associated facet. This region from which the p-contact layer has been completely removed preferably has an extent in the direction perpendicular to this facet of at least 0.5 µm or 2 µm or 5 µm and alternatively or additionally of at most 70% or 50% or 20% of the extent of the associated current protection region, that is in this case of the region from which the p-contact layer has been at least partially removed.

According to at least one embodiment, in at least one current protection region the p-contact layer is partially removed and regions from which the p-contact layer has been removed are filled with a protective material which is transparent for the laser radiation and is electrically insulating or electrically poorly conductive. Poorly conducting can mean that the conductivity of the protective material is then reduced by at least a factor of 10 or 100 or 1000 compared with a conductivity of the p-contact layer. The protective material can be formed from the same materials as the insulator layer. The p-contact layer as a whole together with the protective material preferably forms a layer with mutually opposite, plane-parallel boundary surfaces and with a constant, unchanged thickness.

According to at least one embodiment, a material of the p-contact layer and a blend material are mixed in at least one current protection region. The blend material is electrically insulating and preferably transparent for the laser radiation. A proportion of the blend material increases gradually or stepwise towards the respective facet and/or in the direction away from the active zone.

According to at least one embodiment, a side face of the p-contact layer is completely covered by the protective material, by a material of the insulator layer and/or by a material of the p-contact structure. The side face is preferably oriented parallel or approximately parallel to the associated facet.

According to at least one embodiment, in the direction towards the facet and parallel to the active zone, the p-contact layer, the p-contact structure and the additional layer are arranged one on top of the other, in particular directly one on top of the other. The current protection region is formed either only by the region with the additional layer or by the region with the additional layer and with the p-contact structure, depending on a contact resistance between the p-region and the p-contact structure.

According to at least one embodiment, the additional layer is applied both in the current protection region and on the associated facet. The additional layer can be a layer stack by means of which a reflectivity of the associated facet is set. For example, the additional layer is designed as an antireflection layer or as a highly reflective mirror. The additional layer can have a sequence of layers with alternately high and low refractive indices for the laser radiation.

According to at least one embodiment, the additional layer is applied to the p-contact layer close to at least one current protection region. In this case, the additional layer can be in direct contact with the p-contact structure. The current protection region is in particular only that region in which the additional layer is in direct contact with the p-region.

According to at least one embodiment, in the current protection region the additional layer is partially or completely covered by the p-contact structure. In particular, the p-contact structure can then end flush with the associated facet.

According to at least one embodiment, a thickness of the additional layer is equal to a thickness of the p-contact layer. Alternatively, it is possible for the additional layer to have a thickness which is equal to a total thickness of the p-contact layer and the p-contact structure. Furthermore, it is possible for the thickness of the additional layer to be greater than the thickness of the p-contact layer, but smaller than the thickness of the p-contact structure.

According to at least one embodiment, the additional layer is spaced apart from the p-contact layer and/or from the p-contact structure, in the direction parallel to the active zone. In the direction parallel to the active zone, a cavity can then be formed between the additional layer and the p-contact layer and/or the p-contact structure.

A semiconductor laser described here is explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

Figure 18:
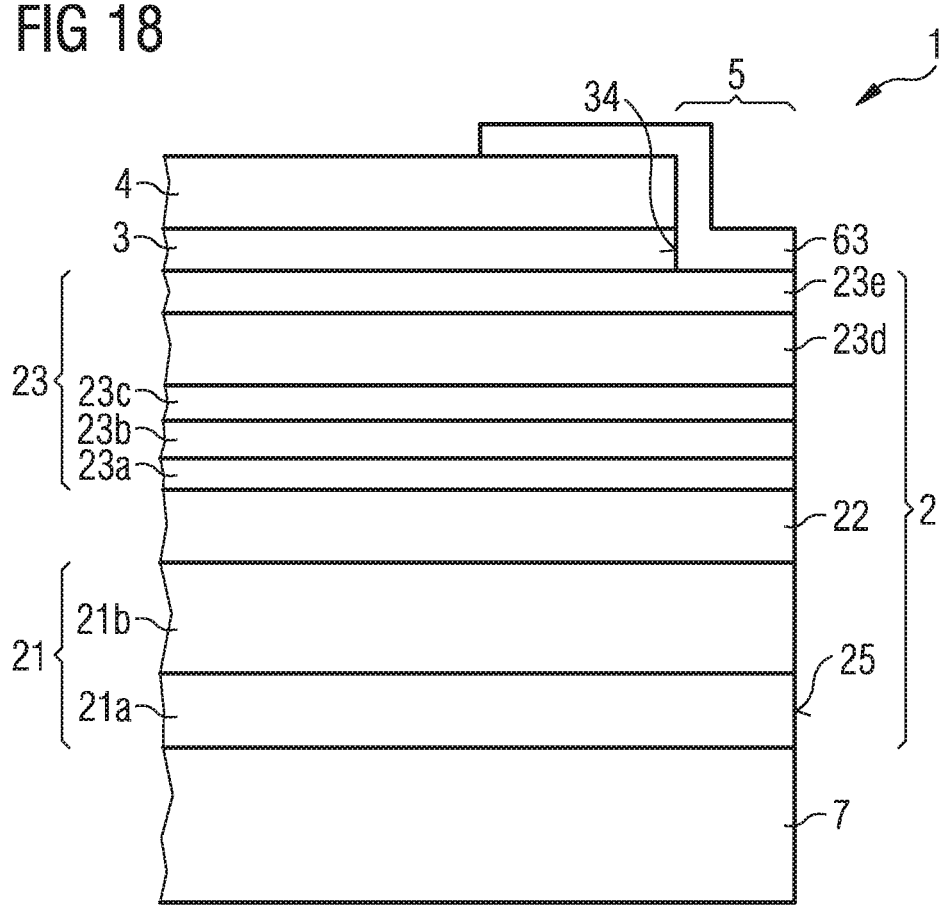
Figure 19:
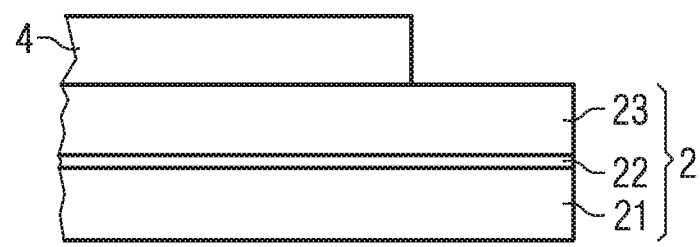

In the Figures:

FIGS. 1 to 18 show schematic sectional representations of exemplary embodiments of semiconductor lasers described here, and FIG. 19 shows a schematic sectional illustration of a modification of a semiconductor laser.

DETAILED DESCRIPTION

FIG. 1 shows an exemplary embodiment of a semiconductor laser 1. A semiconductor layer sequence 2 is arranged on a substrate 7. The semiconductor layer sequence 2 has an n-conducting n-region 21, an active zone 22 and a p-conducting p-region 23. The n-region 21, the active zone 22 and the p-region 23 follow one another directly in the direction away from the substrate 7.

A current impression into the semiconductor layer sequence 2 takes place on the one hand from the direction of the substrate 7 and/or from the n-region 21 and on the other hand from a p-contact layer 3 and a p-contact structure 4. The p-contact structure 4 is formed from at least one metal. In particular, the semiconductor laser 1 can be electrically contacted externally via the p-contact structure 4, for example by means of soldering or via a bonding wire. The p-contact layer 3 is a transparent conductive layer, in particular of ITO, $In_2O_3$, $SnO_2$ or ZnO or combinations thereof.

The p-contact layer 3 is part of a cladding layer of the semiconductor laser 1. Accordingly, intentionally a finite intensity I of a laser radiation generated in the active zone 22 is still present in the p-contact layer 3. For example, a wave guide is essentially limited to the active zone 22 and cladding layers for wave guiding are formed, on the one hand, by the n-region 21 and, on the other hand, by the p-region 23 together with the p-contact layer 3.

In the direction parallel to the active zone 22, the semiconductor layer sequence 2 is delimited by a facet 25. A reflection or a coupling-out of the generated laser radiation takes place at the facet 25. Accordingly, a highly reflective or anti-reflective layer is preferably applied to the facet 25, not shown. In all exemplary embodiments, a passivation layer (not shown) is furthermore preferably located on the semiconductor layer sequence 2.

Close to the facet 25, an insulator layer 6 is located in a current protection region 5 directly on the p-region 23 and below the p-contact layer 3. The insulator layer 6 prevents current from being impressed from the p-contact layer 3 into the p-region 23 directly at the facet 25. In the direction away from the facet 25, the current protection region 5 preferably has an extent of 5 µm to 40 µm or of 10 µm to 20 µm.

As in all other exemplary embodiments, the p-region 23, together with the p-contact layer 3, has a sufficient thickness in order to keep the laser radiation away from the metallic and thus comparatively strongly absorbing p-contact structure 4. In other words, the intensity I on the contact structure 4 is negligible, in contrast to an intensity in the p-contact layer 3 itself. A thickness of the preferably uniformly thick p-contact layer 3 is, for example, at least 5 nm or 50 nm or 100 nm and/or at most 1 µm or 0.5 µm or 250 nm, for example between 100 nm and 250 nm inclusive. By using the p-contact layer 3 as part of a cladding layer, the remaining p-region 23 can be designed relatively thin. This makes it possible to reduce a forward voltage of the semiconductor laser 1.

In the other exemplary embodiments, a profile of the intensity I and the substrate 7 are not shown in the drawings. However, in this regard, the same as explained in conjunction with FIG. 1 applies in the other exemplary embodiments, unless indicated otherwise.

In the exemplary embodiment of FIG. 2, the current protection region 5 is formed by a local modification 61 of the p-region 23. By way of example, a contact resistance between the semiconductor layer sequence 2 and the p-contact layer 3 is locally increased, for example by means of back-sputtering, etching or plasma damage of the p-region 23, so that no current or substantially no current is impressed into the semiconductor layer sequence 2 in the current protection region 5.

In the exemplary embodiment of FIG. 3, in the current protection region 5 a modification 62 in the p-contact layer 3 itself is formed. For example, the p-contact layer 3 is subjected to a temperature treatment in the modification 62, in particular a heat treatment, so that a contact resistance towards the p-region 23 is increased or such that an electrical conductivity in the modification 62 is reduced relative to remaining regions of the p-contact layer 3.

In the exemplary embodiments of FIGS. 1 to 3, both the p-contact layer 3 and the p-contact structure 4 terminate flush with the facet 25 on the semiconductor layer sequence 2. In the exemplary embodiment of FIG. 4, on the other hand, both the p-contact structure 4 and the p-contact layer 3 are completely removed from the current protection region 5.

Figure 5:
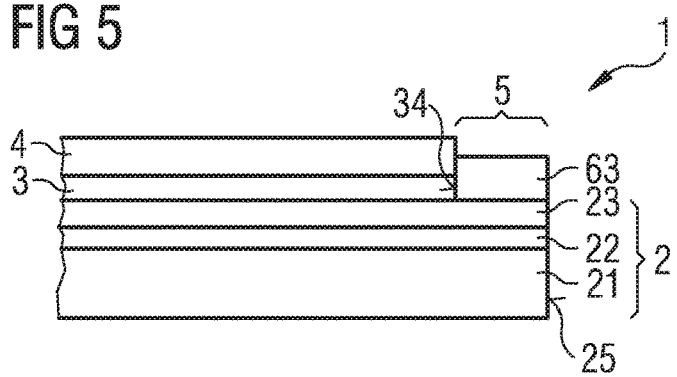

In the exemplary embodiment of FIG. 5, an additional layer 63 is applied in the current protection region 5. The additional layer 63 is preferably produced from a material which is transparent to the laser radiation and has a comparatively low refractive index. It is likewise possible for the additional layer 63 to have a refractive index which deviates from a refractive index of the contact structure 3 only by at most 0.2 or 0.1 or 0.05. By means of the additional layer, a wave guiding of the laser radiation in the region of the facet 25 is possible.

The additional layer 63 can have a thickness which is greater than the thickness of the p-contact layer 3. Alternatively, it is possible that the thickness of the additional layer 63 is equal to or even smaller than the thickness of the p-contact layer 3. For example, the additional layer 63 is made of an electrically poorly conductive material such as $Al_2O_3$, $SiO_2$, $TiO_2$, $Ta_2O_5$, $HfO_2$, $Si_3N_4$ or AlN.

Alternatively, it is possible for the additional layer 63 to be formed from an electrically non-conductive, but thermally highly conductive material, in order to ensure a thermal connection of the region close to the facet 25 to the thermally highly conductive p-contact structure 4. Materials for the additional layer 63 are then, in particular, diamond-like carbon, SiC or AlN. In this case, a specific thermal conductivity of the material for the additional layer 63 is preferably at least 10 W/m·K or 50 W/m·K or 100 W/m·K.

Figure 6:
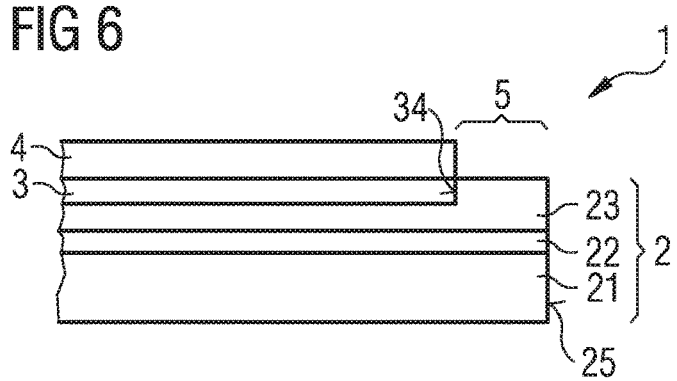

In the next exemplary embodiment, see FIG. 6, the p-region 23 is structured. Outside the current protection region 5, a thickness of the p-region 23 is reduced. Thus, a recess is formed in the p-region 23 outside the current protection region 5. A depth of this recess is preferably at least 10 nm or 50 nm or 100 nm and/or at most 1 µm or 0.5 µm or 250 nm. This recess is completely or partially filled with the p-contact layer 3.

According to FIG. 6, in the current protection region 5 the p-contact layer 3 terminates flush with the p-region 23 in the direction away from the active zone 22. Alternatively, in the recess the p-contact layer 3 can have a smaller or a greater thickness and can thus project from the p-region 23 or vice versa.

Figure 7:
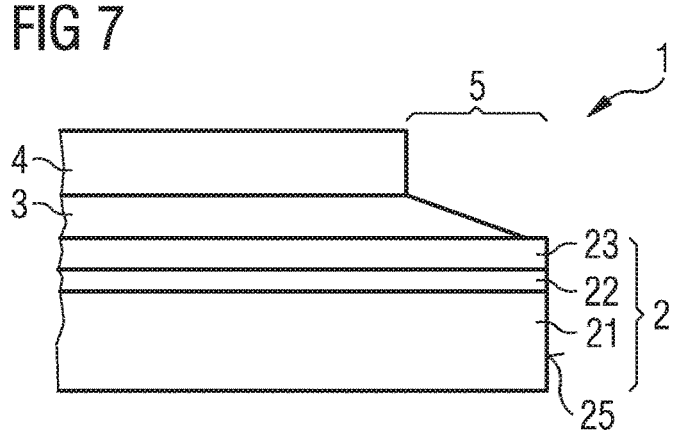

According to FIG. 7, in the current protection region 5 the p-contact layer 3 becomes continuously thinner towards the facet 25. As a result, a gradual transition of the refractive index for the laser radiation to the facet 25 can be achieved, as a result of which optical losses can be reduced. A region directly at the facet 25 is preferably completely free of the p-contact layer 3. Unlike shown, the p-contact layer 3 can narrow towards the facet 25 not only linearly but also in a curved manner.

By means of an internal structuring of the p-contact layer 3, in the direction away from the active zone it is possible that the refractive index decreases in the current protection region. This is possible, for example, by means of recesses in the p-contact layer 3, the volume of which increases in the direction away from the active zone 22.

Figure 8:
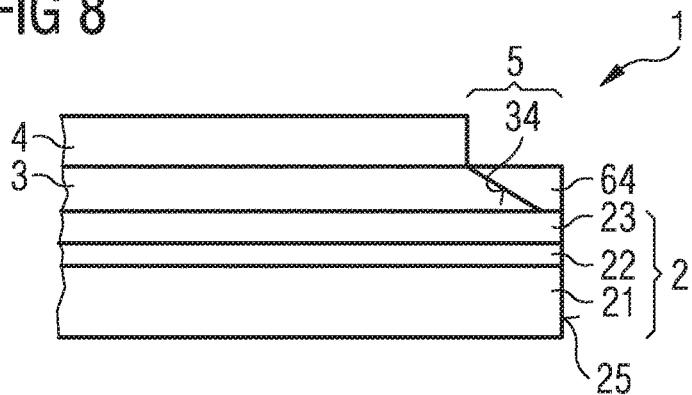

In the exemplary embodiment of FIG. 8, the region removed from the p-contact layer 3 is filled with a protective material 64, so that in total a layer with a constant layer thickness results, which extends as far as the facet 25. The same materials as used for the insulator layer 6 can be used for the protective material 64, which can in turn be formed from the same materials as the additional layer 63.

Figure 9:
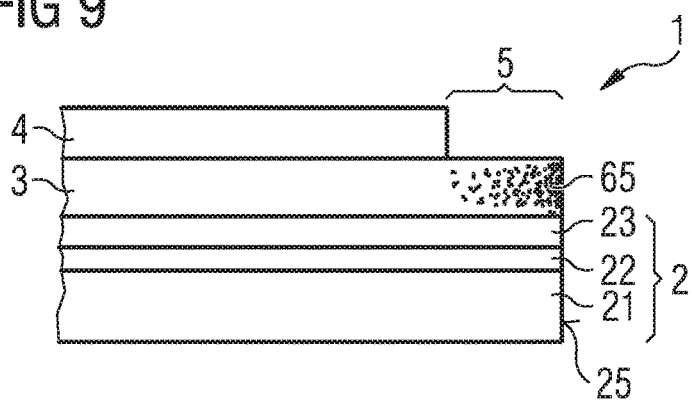

In the exemplary embodiment of FIG. 9, in the current protection region 5 the material of the p-contact layer 3 is mixed with a blend material 65. In this case, a proportion of the blend material 65 increases monotonically and gradually in the direction towards the facet 25. For example, in the direction towards the facet 25 portions of In, Sn, N, O and/or Zn can be varied, in particular a composition of ITO.

Figure 10:
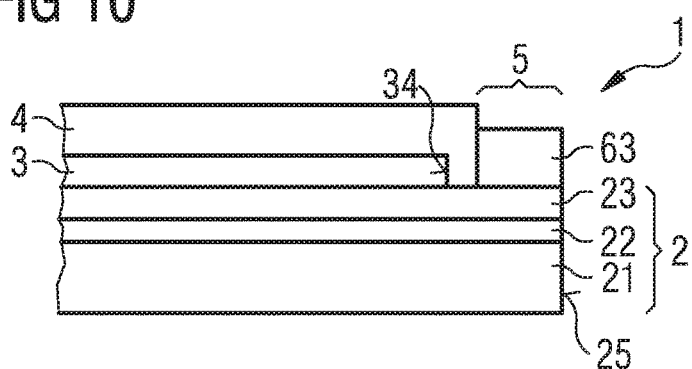

In the exemplary embodiment of FIG. 10, the side face 34 of the p-contact layer 3 is completely covered by the p-contact structure 4. Thus, the p-contact structure 4 is L-shaped when viewed in cross-section. For example, during production of the facets 25 or in other processing steps, it is thereby possible that the metallic p-contact structure 4 protects the p-contact layer 3. Optionally, the additional layer 63 is again present, which directly adjoins the p-contact structure 4 in the direction away from the p-contact layer.

Figure 11:
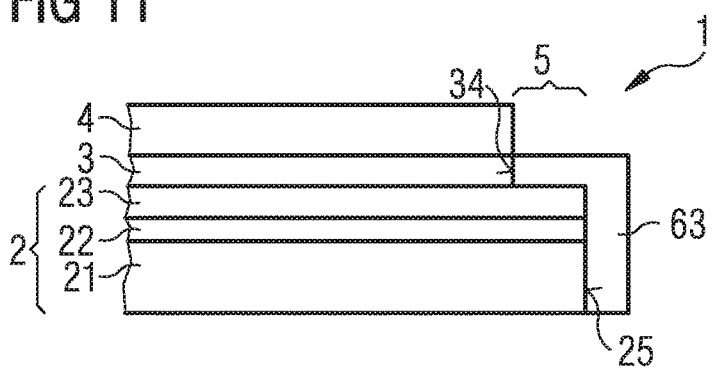

In the exemplary embodiment of FIG. 11, the additional layer 63 is mounted both as an extension of the p-contact layer 3 and on the facet 25. In this case, the additional layer 63 is preferably embodied as an antireflection layer or as a highly reflective layer for the laser radiation generated in the active zone 22. In this case, a thickness of the additional layer 63 at the facet 25 can be equal to a thickness at the p-region 23, as an extension of the p-contact layer 3. Likewise, the thicknesses at the different legs of the L-shaped additional layer 63 viewed in cross section can be different from one another. It is likewise possible for the facet 25 to be covered only partially by the additional layer 63, unlike in FIG. 11. Furthermore, in contrast to the illustration in FIG. 11, the protective additional layer 63 can partially cover the p-type contact structure 4.

Figure 12:
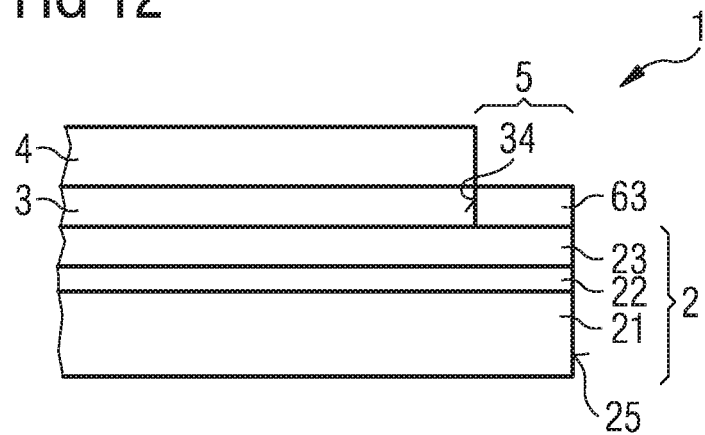

In the exemplary embodiment of FIG. 12, the additional layer 63 terminates flush with the p-contact layer 3 in the direction away from the active zone. The p-contact layer 3 and the p-contact structure 4 end flush with one another, in the direction perpendicular to the facet 25. A corresponding configuration of the additional layer 63 can also be present in FIG. 5, 10 or 11.

Figure 13:
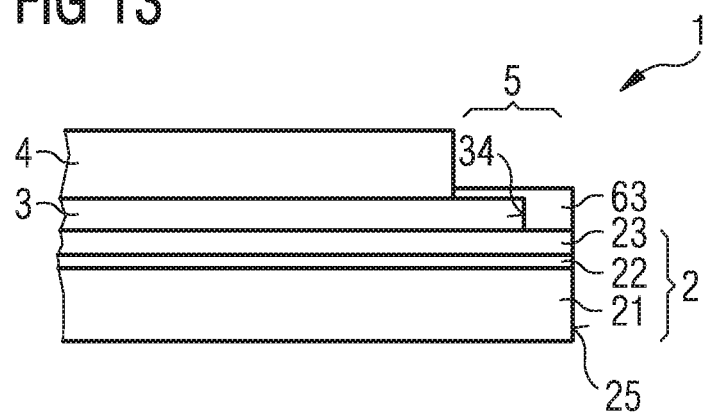

According to the exemplary embodiment as shown in FIG. 13, the p-contact layer 3 projects beyond the p-contact structure 4, in the direction towards the facet 25. The additional layer 63 completely covers the p-contact layer 3, together with the p-contact structure 4. In the region in which the additional layer 63 is applied to the p-contact layer 3, the additional layer 63 preferably has a smaller thickness than the p-contact layer 3.

Figure 14:
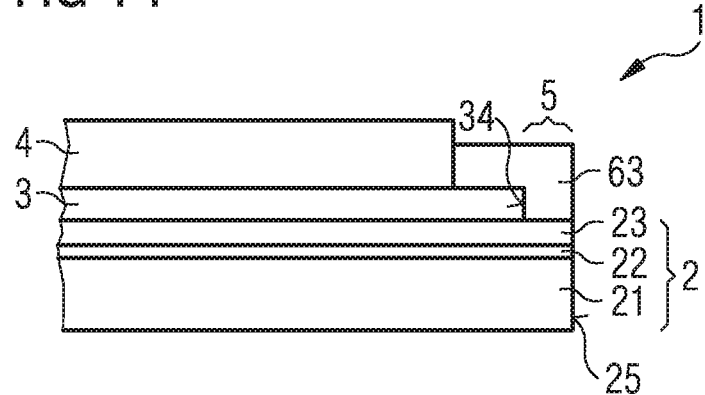

Unlike in FIG. 13, in FIG. 14 in the direction away from the active zone 22 the additional layer 63 is designed comparatively thick above the p-contact layer 3, in particular thicker than the p-contact layer 3 itself.

Deviating from the representation in FIG. 14 it is possible, as shown in FIGS. 5 and 10 to 13, that the additional layer 63 does not extend all the way to the facet 25. The same also applies with regard to FIGS. 15 to 17.

Figure 15:
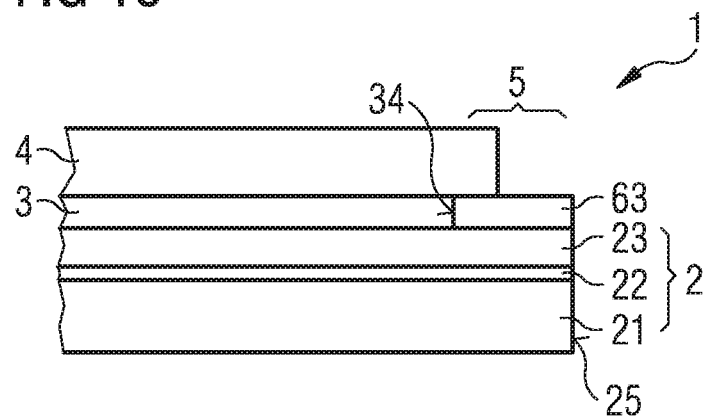

In the exemplary embodiment of FIG. 15, the additional layer 63, which completely covers the side surfaces 34 of the p-contact layer 3, is partially mantled by the p-contact structure 4. In contrast to the illustration, a lateral boundary face of the p-contact structure 4 can not only be arranged parallel to the facet 25, but also at an angle to the facet 25 or also in a rounded manner.

Figure 16:
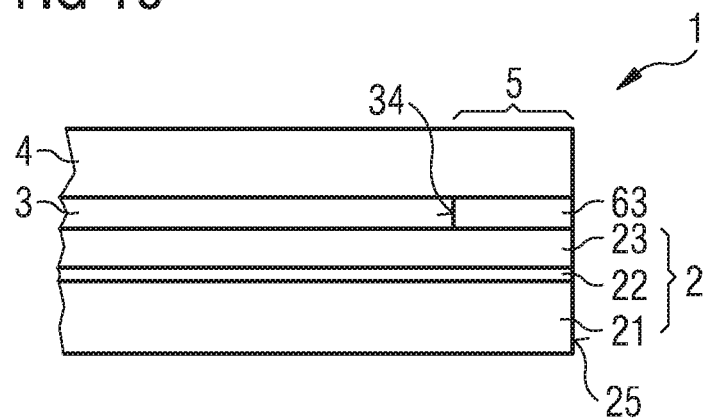

In contrast to FIG. 15, according to FIG. 16 the p-contact structure 4 completely covers the additional layer 63.

Figure 17:
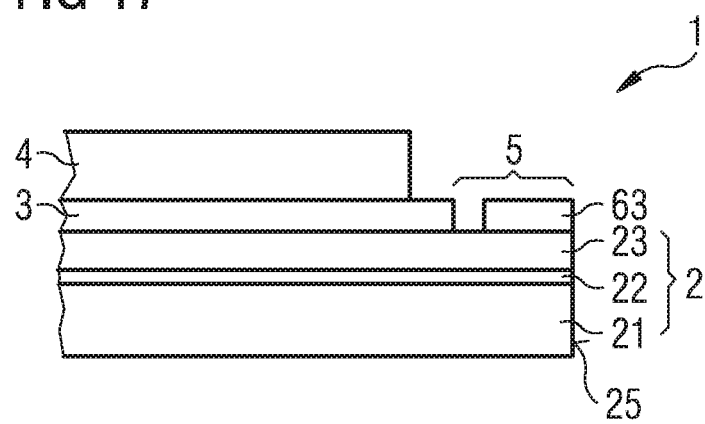

In the exemplary embodiment as shown in FIG. 17, there is an intermediate space between the p-contact layer 3 and the additional layer 63, in the direction parallel to the active zone, in particular there is a cavity. The p-contact structure 4 and the p-contact layer 3 run in a stepped manner in the direction towards the facet 25.

FIG. 18 shows a structure of the semiconductor layer sequence 2 in more detail. Such a structure is preferably also present in all other exemplary embodiments. The n-region 21 is, in the direction away from the substrate, composed of an n-cladding layer 21a and an n-waveguide 21b. In the direction away from the active zone 22, a p-waveguide 23a, 23c, a p-cladding layer 23d and a p-type semiconductor contact layer 23e are located in the p-region 23. The entire p-region is preferably based on the same material system.

Optionally, the p-waveguide is divided into the two partial layers 23a, 23c, between which an electron barrier layer 23b can be located.

According to FIG. 18, the electrically insulating or electrically poorly conductive additional layer 63 partially covers the metallic p-contact structure 4.

In all the exemplary embodiments, it is possible for the insulator layer 6, the additional layer 63 and/or the protective material 64 to be composed of a plurality of partial layers, wherein these partial layers preferably follow one another directly in each case. Furthermore, the exemplary embodiments can be combined with one another; by way of example, in connection with FIG. 7 in each case additional layers 63 can be present, as shown, for example, in FIGS. 10 to 17. It is also possible in all embodiments that the facet 25 is partially or completely covered by the additional layer 63 or else by a protective material 64 and/or the insulator layer 6.

The semiconductor lasers 1 each have in particular two mutually opposite facets 25 which are oriented parallel to one another. The facets 25 are particularly preferably each provided with a current protection region 5, wherein both facets can be formed by a similar current protection region 5, or wherein different current protection regions 5, as illustrated in conjunction with FIGS. 1 to 18, can be combined with one another in a single semiconductor laser 1.

FIG. 19 shows a modification of a semiconductor laser. In this case, no transparent p-contact layer is present so that the p-region 23 is comparatively thick, which can lead to an increase in a series resistance and/or a forward voltage and thus to a limited efficiency. In contrast, the semiconductor lasers 1 of FIGS. 1 to 18 have an improved series resistance due to the substitution of the cladding layer by the p-contact layer 3. The stability of the facet 25 is likewise increased, since no charge carrier recombination takes place directly at the facet 25. By withdrawing a current from the facet 25, the formation of leakage currents across the facet 25 is also avoided. Furthermore, contamination of the facet 25 by metals is prevented, since all metals can be eliminated from the facet region. In addition, heat dissipation out of the region of the facet 25 is improved by highly heat-conducting materials, for example by means of the p-contact structure 4 which terminates flush with the facet 25.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

LIST OF REFERENCE SIGNS 1 semiconductor laser
2 semiconductor layer sequence
21 n-region
22 active zone
23 p-region
25 facet
3 transparent p-contact layer
34 side face of the p-contact layer
4 metallic p-contact structure
5 current protection region
6 insulator layer
61 modification of the p-region
62 modification of the p-contact layer
63 additional layer 64 protective material
65 blend material
7 substrate for the semiconductor layer sequence
I intensity of the laser radiation

The invention claimed is:

1. A semiconductor laser comprising
a semiconductor layer sequence which has an n-conducting n-region, a p-conducting p-region and an intermediate active zone for generating laser radiation,
a p-contact layer which is transmissive to the laser radiation and which is made of a transparent conductive oxide and which is designed for impressing current directly into the p-region, and
an electrically conductive and metallic p-contact structure which is located directly on the p-contact layer,
wherein
the p-contact layer is part of a cladding layer for guiding the laser radiation so that the laser radiation intentionally enters the p-contact layer during operation of the semiconductor laser,
the semiconductor layer sequence has two facets which form resonator end faces for the laser radiation,
in at least one current protection region directly on at least one of the facets a current impression into the p-region is suppressed,
in the direction perpendicular to the associated facet the current protection region has an extent of at least 0.5 µm and of at most 100 µm and additionally of at most 20% of a resonator length for the laser radiation, and
in the at least one current protection region the p-contact layer is only partially removed, so that in said current protection region the p-contact layer becomes continuously thinner towards the associated facet and a region directly at the associated facet is completely free of the p-contact layer, so that an effective refractive index for the laser radiation in the p-contact layer decreases in the direction towards the associated facet.

2. The semiconductor laser according to claim 1,
in which the p-contact layer and the p-contact structure terminate flush with at least one of the facets in the direction parallel to the active zone.

3. The semiconductor laser according to claim 1,
in which in at least one current protection region there is an electrical insulator layer between the p-contact layer and the p-region,
wherein the insulator layer has a constant thickness, which is at most 1 µm.

4. The semiconductor laser according to claim 1,
in which in at least one current protection region the p-region is modified directly on the p-contact layer, so that in this current protection region current impression into the p-region is prevented or is reduced by at least a factor of 10.

5. The semiconductor laser according to claim 1,
in which in at least one current protection region the p-contact layer is directly connected to the p-region, so that in this current protection region current impression into the p-region is prevented or is reduced by at least a factor of 10.

6. The semiconductor laser according to claim 1,
in which the p-contact layer and the p-contact structure are removed in at least one current protection region.

7. The semiconductor laser according to claim 1,
in which the p-contact layer is removed in at least one current protection region and in the current protection region at least one additional layer is applied directly to the p-region,'
wherein the additional layer is electrically insulating.

8. The semiconductor laser according to claim 7,
in which the additional layer has a higher specific thermal conductivity than the p-region.

9. The semiconductor laser according to claim 1,
in which in at least one current protection region the p-region has a greater thickness than in remaining regions and the p-contact layer is removed from the current protection region,
wherein the p-contact layer, in the direction away from the active zone terminates flush with the p-region which is located in the current protection region.

10. The semiconductor laser according to claim 1,
in which in at least one current protection region the p-contact layer is only partially removed, so that in the current protection region an effective refractive index for the laser radiation in the p-contact layer decreases in the direction towards the associated facet and in the direction away from the active zone,
wherein the p-contact layer is completely removed directly at the associated facet.

11. The semiconductor laser according to claim 1 one of the, in which in at least one current protection region the p-contact layer is partially removed, and regions from which the p-contact layer has been removed are filled with an electrically insulating protective material which is transparent to the laser radiation.

12. The semiconductor laser according to claim 1,
in which in at least one current protection region a material of the p-contact layer is mixed with a transparent and electrically insulating blend material,
wherein a proportion of the blend material increases gradually or stepwise in the direction towards the associated facet or in the direction away from the active zone.

13. The semiconductor laser according to claim 7,
in which the p-contact layer is completely removed from at least one current protection region,
wherein the p-contact structure completely covers a side face of the p-contact layer,
wherein the additional layer is additionally applied in different areas in the current protection region so that in the direction parallel to the active zone the p-contact layer, the p-contact structure and the additional layer follow one another.

14. The semiconductor laser according to claim 7,
in which in at least one current protection region the additional layer is applied both in the current protection region and on the associated facet.

15. The semiconductor laser according to claim 7,
in which close to at least one current protection region the additional layer is applied to the p-contact layer and is in direct contact with the p-contact structure.

16. The semiconductor laser according to claim 7,
in which in at least one current protection region the additional layer is partially or completely covered by the p-contact structure,
wherein a thickness of the additional layer is equal to a thickness of the p-contact layer.

17. The semiconductor laser according to claim 7,
in which in at least one current protection region the additional layer is spaced apart from the p-contact layer in the direction parallel to the active zone.

18. A semiconductor laser comprising
a semiconductor layer sequence which has an n-conducting n-region, a p-conducting p-region and an intermediate active zone for generating laser radiation, a p-contact layer which is transmissive to the laser radiation and which is made of a transparent conductive oxide and which is designed for impressing current directly into the p-region, and an electrically conductive and metallic p-contact structure which is located directly on the p-contact layer, wherein the p-contact layer is part of a cladding layer for guiding the laser radiation so that the laser radiation intentionally enters the p-contact layer during operation of the semiconductor laser, the semiconductor layer sequence has two facets which form resonator end faces for the laser radiation, in at least one current protection region directly on at least one of the facets a current impression into the p-region is suppressed, and in the direction perpendicular to the associated facet the current protection region has an extent of at least 0.5 µm and of at most 100 µm and additionally of at most 20% of a resonator length for the laser radiation, the p-contact layer is completely removed from the at least one current protection region and in said current protection region at least one additional layer is applied directly to the p-region, the additional layer is electrically insulating, in said current protection region, the p-contact structure completely covers a side face of the p-contact layer, and in a direction parallel to the active zone, at said current protection region the p-contact layer, the p-contact structure and the additional layer follow one another.

19. A semiconductor laser comprising a semiconductor layer sequence which has an n-conducting n-region, a p-conducting p-region and an intermediate active zone for generating laser radiation;

a p-contact layer which is transmissive to the laser radiation and which is made of a transparent conductive oxide and which is designed for impressing current directly into the p-region, and an electrically conductive and metallic p-contact structure which is located directly on the p-contact layer, wherein the p-contact layer is part of a cladding layer for guiding the laser radiation so that the laser radiation intentionally enters the p-contact layer during operation of the semiconductor laser, the semiconductor layer sequence has two facets which form resonator end faces for the laser radiation, in at least one current protection region directly on at least one of the facets a current impression into the p-region is suppressed, in the direction perpendicular to the associated facet the current protection region has an extent of at least 0.5 µm and of at most 100 µm and additionally of at most 20% of a resonator length for the laser radiation, the p-contact layer is removed from the at least one current protection region and in said current protection region at least one additional layer is applied directly to the p-region, the additional layer is electrically insulating, and in said current protection region the additional layer is also applied on the associated facet.

20. The semiconductor laser according to claim 19, wherein the additional layer is embodied as an antireflection layer or as a highly reflective layer for the laser radiation generated in the active zone, a thickness of the additional layer is the same as a thickness of the p-coated layer, the associated facet is covered only partially by the additional layer, and the additional layer partially covers the p-type contact structure.

* * * * *

UNITED STATES PATENT AND TRADEMARK OFFICE
CERTIFICATE OF CORRECTION

PATENT NO. : 10,811,843 B2
APPLICATION NO. : 15/761419
DATED : October 20, 2020
INVENTOR(S) : Sven Gerhard et al.

Page 1 of 1

It is certified that error appears in the above-identified patent and that said Letters Patent is hereby corrected as shown below:

In the Claims

Column 11, Line 66 (Claim 7): delete the """ at the end of this line,

Column 12, Lines 22 and 23 (Claim 11): delete "one of the",

Column 14, Line 31 (Claim 20): delete "p-coated" and insert therefor --p-contact--.

Signed and Sealed this
Nineteenth Day of January, 2021

Andrei Iancu
*Director of the United States Patent and Trademark Office*